United States Patent [19]

Roth et al.

[11] Patent Number: 4,867,715
[45] Date of Patent: Sep. 19, 1989

[54] INTERCONNECTION LEAD WITH REDUNDANT BONDING REGIONS

[75] Inventors: Norman J. Roth, Kokomo; Ronnie J. Runyon, Russiaville, both of Ind.

[73] Assignee: Delco Electronics Corporation, Kokomo, Ind.

[21] Appl. No.: 188,928

[22] Filed: May 2, 1988

[51] Int. Cl.⁴ .......................... H01R 9/09; H05K 3/34
[52] U.S. Cl. ..................................... 439/876; 29/827; 357/70
[58] Field of Search .............................. 439/55, 68–70, 439/876; 357/69, 70; 361/405–408; 174/52.4; 29/827, 832, 840

[56] References Cited

U.S. PATENT DOCUMENTS

| 3,834,604 | 9/1974 | Fendley et al. | 228/5 |
| 4,034,149 | 7/1977 | Zaleckas | 174/68.5 |
| 4,109,096 | 8/1978 | Dehaine | 361/408 |
| 4,631,820 | 12/1986 | Harada et al. | 174/52.4 |

FOREIGN PATENT DOCUMENTS

| 54-113249 | 9/1979 | Japan | 357/70 |
| 61-214548 | 9/1986 | Japan | 357/70 |
| 1209901 | 10/1970 | United Kingdom | 174/52.4 |

Primary Examiner—Neil Abrams
Attorney, Agent, or Firm—Domenica N. S. Hartman

[57] ABSTRACT

Redundant interconnection bonds are formed on an integrated circuit using an interconnection lead comprising a plurality of electrically conductive fingers separated from each other by an electrically nonconductive medium. The individual conductive fingers are attached to, and extend out from, an electrically conductive base at one end. In addition, the individual conductive fingers are connected to each other at a separate region. The improved interconnect lead is structurally durable and the resulting redundant bond exhibits improved electrical and operating characteristics. The interconnection lead is suitable for use with tape automated bonding or flexible circuitry technologies.

8 Claims, 2 Drawing Sheets

INTERCONNECTION LEAD WITH REDUNDANT BONDING REGIONS

This invention relates to the design of interconnection leads for electrically connecting an integrated circuit with a supporting substrate. More particularly, this invention relates to interconnection leads which are redundant, for use with either tape automated bonding techniques or flexible circuitry techniques.

BACKGROUND OF THE INVENTION

Many methods are known for forming the electrical interconnections between an integrated circuit and the supporting substrate. Tape automated bonding (TAB) is one commonly known method for forming these such electrical interconnections. A TAB tape is provided which comprises a plurality of individual long, slender inner leads attached to, and extending out from, generally wider, larger outer leads. There may be many of these inner/outer lead configurations on a single TAB tape.

An individual inner lead on the TAB tape is bonded to the integrated circuit at a bonding pad so as to form in inner lead bond. There are typically many of these inner lead bonds on a single integrated circuit. The inner lead bonds are typically formed by first depositing a gold bump, or other suitable material, on either the end of the TAB tape inner lead or on the integrated circuit itself. The integrated circuit and TAB tape inner leads, which are generally copper, are then aligned and simultaneously thermocompression gang bonded.

After bonding between the integrated circuit and inner leads is complete, the integrated circuit is excised from the TAB tape at a point beyond the outer lead, so that the outer lead remains attached to the bonded inner lead and integrated circuit. The integrated circuit assembly is subsequently mounted on a substrate, if this has not already been done, and the outer leads are appropriately bonded to the substrate.

A significant drawback associated with the tape automated bonding method for forming the electrical interconnections between the integrated circuits and substrates is that the individual inner leads are highly susceptible to deformation. The individual inner leads are both thin and narrow, extending out from the more structurally durable outer leads in an unsupported manner. Therefore, the inner leads are extremely fragile and highly susceptible to deformation during processing and handling. This high susceptibility to deformation renders processing of the inner leads very difficult without disturbing the inner leads' position and location relative to the integrated circuit, substrate and other inner leads.

The use of these fragile inner leads results in higher rejection rates and lower levels of reproducibility than desired. In addition, the use of individual thin and narrow inner leads effects the electrical performance of the integrated circuit by limiting the current carrying capacity, increasing the electrical resistance, and limiting the heat transfer from the integrated circuit to the substrate through the interconnection.

In an alternative bonding method, a flexible circuit (FLEX) is used to form the electrical interconnections between the integrated circuit and the substrate, the substrate being an integral part of the flexible circuit itself. The FLEX circuit consists of a patterned arrangement of conductors on a flexible insulating base substrate with or without cover layers. The FLEX circuit may be single or double sided, multi-layered, or rigidized, in addition to other possible arrangements. The FLEX circuit may be formed by several methods, such as by laminating copper foil to any of several base substrate materials, or alternatively pattern plating copper directly onto the substrate.

The FLEX circuit is advantageous in that it contains both the internal and external integrated circuit chip interconnections. The inner leads are adjacent to and an integral part of the flexible circuitry pattern. Outer leads are not required because the individual inner leads are incorporated within the flexible circuitry pattern. In addition, the flexible circuitry pattern is supported by the flexible insulating substrate and electrically connected at the appropriate regions. Therefore outer lead bonds are not necessary and correspondingly the number of interconnections are substantially reduced.

For these reasons, flexible circuitry technology has many advantages. FLEX circuitry significantly reduces the number of chip interconnections resulting in reduced lead inductance and lead-to-lead capacitance, as well as increased product reliability. In addition, the use of the FLEX circuitry permits smaller integrated circuits and interconnection patterns because the chip is mounted directly onto the patterned substrate.

However, despite these advantages of FLEX circuitry, a significant disadvantage exists —similar to the disadvantage encountered with the use of TAB-tapes. The inner leads extending from the flexible circuitry pattern are individual fragile strips of copper. Analagous to the TAB inner leads, these leads are narrow strips extending beyond the main, more structurally durable, circuit pattern supported by the flexible substrate. As with the TAB inner leads, this fragile configuration is highly susceptible to deformation and results in the inner leads being extremely difficult to process or handle without disturbing the lead's position or location relative to the FLEX circuitry substrate, the integrated circuit and the other inner leads. This produces higher than desired rejection rates and decreased electrical properties, similar to the problems encountered with tape automated bonding.

It is therefore advantageous to provide an inner interconnection lead, suitable for bonding to an integrated circuit for electrically interconnecting the integrated circuit to a substrate, which is both structurally durable and electrically efficient. It is further desirable that the interconnection lead have a low susceptibility to deformation. In addition, it is desirable that the provided interconnection lead be suitable for use with either tape automated bonding or flexible circuitry technologies.

SUMMARY OF THE INVENTION

It is therefore an object of this invention to provide an interconnection lead suitable for bonding to an integrated circuit for electrically interconnecting the integrated circuit to a substrate.

It is a further object of this invention that the provided interconnection lead be highly reliable, therefore structurally durable with a low susceptibility to deformation, and have highly efficient electrical characteristics.

It is still a further object of this invention to provide a redundant bond between the interconnection lead and the integrated circuit, and to provide an interconnection lead suitable for use with either the tape automated bonding or the flexible circuitry technologies.

In accordance with a preferred embodiment of this invention these and other objects and advantages are accomplished as follows.

This invention comprehends an interconnection lead for electrical connection to an integrated circuit at a bonding pad. The interconnection lead comprises a plurality of electrically conductive fingers having a first end and a terminal end. Each of the fingers are mutually separated from each of the other fingers by an electrically insulative medium, such as air. The interconnection lead further comprises an electrically conductive base. The plurality of conductive fingers are an integral part of, and extend out from the conductive base at their first end. In addition, the interconnection lead further comprises means for connecting the fingers to each other at a region distinct from the conductive base.

The connection means may contact the fingers at their terminal end or at a region intermediate between the first end and the terminal end of each of said fingers. Further, the connection means may be electrically conductive and may comprise means for concentrating the stress within the interconnection lead at one point, such as by the use of a notched stress risor.

The plurality of conductive fingers may electrically contact a single bond pad or there may be a separate bond pad for each of the conductive fingers. Further, the bonding may be done at the terminal end of the fingers, at a region intermediate between the terminal end and the first end, or at the connection means if the connection means is electrically conductive.

The base of the interconnection lead may be integrated into an outer lead and therefore suitable for use with tape automated bonding techniques, or the base may be electrically integrated into a conductive flexible circuitry pattern and therefore correspondingly significantly reduce the number of interconnection bonds required.

Other objects and advantages of this invention will be better appreciated from a detailed description thereof, which follows.

BRIEF DESCRIPTION OF THE DRAWINGS

The following detailed description of the preferred embodiment of the invention may be best understood when reference is made to the accompanying drawing.

DETAILED DESCRIPTION

In accordance with this invention, the shortcomings of the currently used methods for bonding are overcome by providing redundant interconnection leads. The interconnection leads are redundantly bonded to an integrated circuit at a bond pad, such that two or more of the fingers comprised within the redundant interconnection lead are electrically connected to the integrated circuit in parallel. The structural durability of the redundant interconnection leads is greatly enhanced because the individual conductive fingers are not only physically and electrically connected at a first end with a conductive base, but also physically connected at a second region of the finger.

The second region wherein the fingers are physically connected may be at the terminal ends of the conductive fingers or at a region intermediate between the terminal and first ends of the fingers. By physically connecting the long, slender conductive strips or fingers at two discrete regions, the fragility of the inner lead is reduced and the individual fingers comprised within the lead are less susceptible to deformation during processing and handling. This results in increased reliability and decreased rejection rates of the parts. In addition, the redundant nature of the bond further results in improved electrical characteristics of the bonded device.

Figure 1:
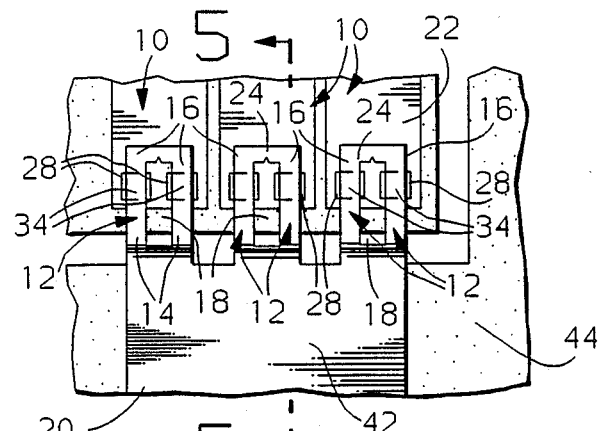
FIG. 1 is a plan view of a redundant interconnection lead made in accordance with this invention using tape automated bonding technology.

As illustrated in FIG. 1, a redundant interconnection lead 10 comprises a plurality of electrically conductive copper fingers 12 having a first end 14 and a terminal end 16. Three separate redundant interconnection leads are shown in FIG. 1, each lead 10 having two conductive fingers 12, and the leads 10 being suitable for use with tape automated bonding techniques, as the three leads 10 are an integral part of the bonding tape as shown. Each of the conductive fingers 12 are mutually separated from each of the other fingers 12 by an electrically insulative medium. Preferably the fingers 12 are formed such that a void 18 exists between each finger, as shown in FIG. 1, therefore air is the electrically insulating and separating medium. Other insulative materials may also be used to separate the individual fingers, such as an organic polyimide material.

It is preferred that the fingers 12 be separated by a flexible and non-rigid medium, so that the stresses incurred during processing and bonding of the leads 10 to the integrated circuit 22 are minimized. In addition, if a material is used as the separating medium, the material must have a compatible coefficient of thermal expansion as compared to the copper fingers 12, so as to reduce the thermally induced stresses.

Each interconnection lead 10 further comprises an electrically conductive base 20. The plurality of conductive fingers 12 are attached to the conductive base 20 at their first end 14, and extend out from the conductive base 20. Therefore the fingers 12 are electrically connected to the base 20 and each of the other fingers 12 at their first ends 14. Preferably the individual fingers 12 are about three times longer than their width, as measured from their first end 14 to their terminal end 16. However, suitable results are obtained when the length of the individual fingers 12 vary between about two to about five times the width dimension.

The length of the finger 12 may be less than about twice the width dimension, however, this situation is generally not within the scope of the present invention since a second region for connection is typically not necessary for providing structural support to the individual fingers 12, i.e., the fingers 12 extend out from the base 20 in an unsupported manner but only for a short distance. Contrary to this, as the ratio of length to width of the finger 12 exceeds about five, the fragility of the individual fingers 12 and suspectibility to deformation increase due to the excessive length, even when the fingers are connected at a second region. Therefore, although there are no limits for the practice of this invention, there are practical limits to the length of the individual fingers 12.

Figure 2:
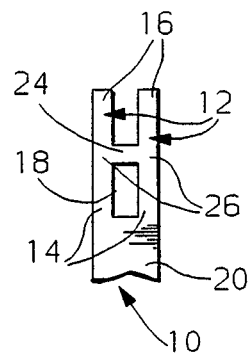
FIG. 2 is a plan view of an alternative interconnection lead made in accordance with this invention having the connector means located intermediate between the first and terminal ends of the conductive fingers.

In addition, the interconnection lead 10 further comprises means for connecting 24 the individual fingers 12 to each other at a region distinct from the conductive base 20. The connection means 24 may contact the fingers 12 at their terminal end 16 or at a intermediate region 26 between the first end 14 and the terminal end 16 of each of said fingers 12 so that the fingers 12 extend freely from the connection means 24, as shown in FIG. 2. Preferably the width of the connection means 24 is about equal to the width of the individual fingers 12. If the width of the connection means 24 is less than this amount, the connection means 24 may not provide adequate support to the individual fingers 12 and may be suspectible to tearing during processing and handling of the leads 10. If the width of the connection means 24 is too large, it may significantly, and detrimentally, increase the physical and thermal stresses incurred during bonding.

The number of individual fingers 12 within the interconnection lead 10 may vary depending on the particular application. In most instances, two fingers 12, as shown, are adequate. Two fingers 12 connected at both a base 20 and at a second region are sufficient to provide the structural stability required during processing and handling. In addition, the two fingers 12 improve the electrical characteristics of the system, since the two fingers 12 are electrically connected in parallel to the integrated circuit 22. The redundancy reduces the electrical resistance of the electrical circuit, and therefore provides improved current carrying capacity. In addition, redundancy provides improved heat transfer characteristics resulting in lower integrated circuit 22 temperatures.

Figure 3:
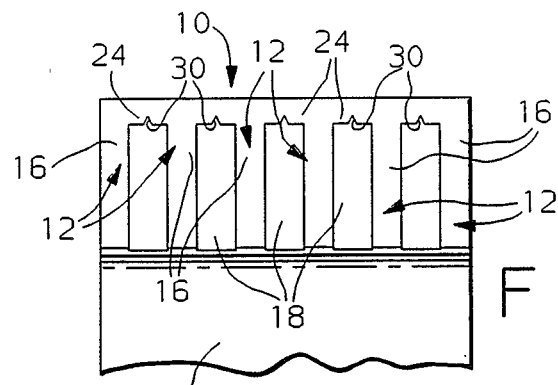
FIG. 3 is a plan view of an alternative interconnection lead made in accordance with this invention having six conductive fingers.

Although two individual fingers 12 are adequate for most applications, the number of fingers 12 may be as great as about six, as shown in FIG. 3. Because the redundancy improves the current carrying capabilities of the system, a large number of fingers 12 is desirable for high current carrying applications, such as power generating sources. As the number of fingers 12 per lead 10 increases above about six, the design of the lead 10 becomes impractical since the bond pad 28 becomes quite large on the integrated circuit 22. In addition, the benefits associated with the redundancy do not significantly increase with additional fingers 12 above about six.

The connection means 24 which physically attaches to each of the fingers 12 at a discrete region separate from the base 20, may comprise means for concentrating the stresses incurred during processing and handling of the lead 10, such as by the use of a notched stress risor 30. This form of strain relief, i.e., a notched stress risor 30, may be provided between the individual fingers 12 as needed. The addition of a stress risor 30 insures that the stress associated with bonding of the individual fingers 12 to the integrated circuit 22 is minimized, and induces the copper leads 10 to fracture at the stress risor 30 instead of at the bond pad 28 during repeated use and thermal cycling.

The plurality of conductive fingers 12 may electrically contact a single bond pad on the integrated circuit 22 or there may be a separate bond pad 28 for each of the conductive fingers 12. The bond pad 28 on the integrated circuit 22 typically comprises a gold bump (not shown). After alignment of the redundant fingers 12 with the gold bumps on the bond pad 28, the fingers 12 are then thermocompression gang bonded to the integrated circuit 22 at the bond pad 28.

Bonding may occur at the terminal end 16 of the fingers 12. Each finger may contact a single bond pad on the integrated circuit 22 or individual bond pads 28, as shown in FIG. 1, for each of the fingers 12. As illustrated in FIG. 1, bonding may also occur at an intermediate region 34 between the terminal end 16 and the first end 14 of the fingers 12, and similarly, the fingers 12 may contact either a single bond pad (not shown) on the integrated circuit 22 or individual bond pads 28.

Figure 4:
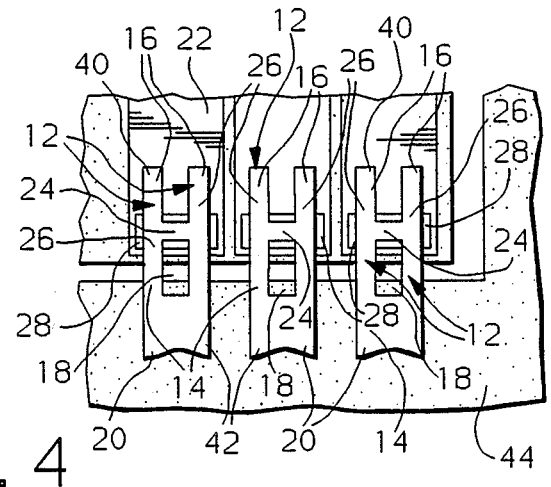
FIG. 4 is a plan view of an alternative bonding arrangement in accordance with this invention.

In addition, bonding may occur at the connection means 24 if the connection means 24 is electrically conductive, as shown in FIG. 4. If bonding occurs at the connection means 24, a single bond pad 28 on the integrated circuit 22 would most generally be used, although it would not be necessary that a single bond pad be used. The connection means 24 could be located at the terminal end 16 of the fingers 12 (not shown) or, as illustrated in FIG. 4, at an intermediate region 26 between the terminal 16 and first ends 14 of the fingers 12.

It may be desirable to bond the lead 10 at the connection means 24 in accordance with FIG. 4, wherein the connection means 24 is electrically conductive and located intermediate 26 between the terminal 16 and first ends 14 of the finger 12, for improved heat transfer during bonding between the integrated circuit 22 and the interconnection lead 10. In this configuration, the integrated circuit 22 is bonded to the lead 10 at a point intermediate 26 between the terminal 16 and first 14 ends of the fingers 12, therefore a portion of the finger 12 extends freely from the bond pad 28. Heat flow during bonding is transferred primarily in a single direction from the bond pad 28 through the portions 40 of the fingers 12 extending freely outward from the connector means 24, and dissipated into the air.

Figure 5:
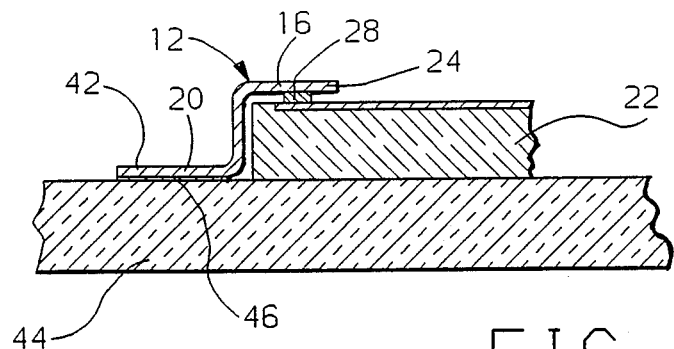
FIG. 5 is a side view of the redundant interconnection lead shown in FIG. 1.
Figure 6:
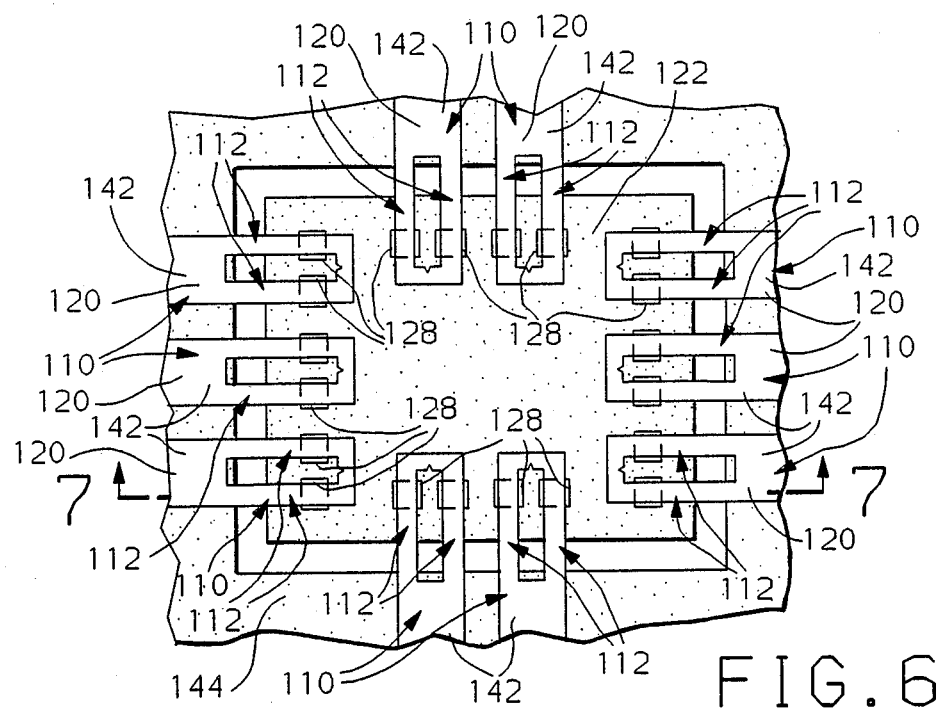
FIG. 6 is a plan view of a redundant interconnection lead made in accordance with this invention using flexible circuitry technology.

The base of the interconnection lead 10 may be integrated into an outer lead 42, as shown in FIGS. 1 and 6 and therefore suitable for use with tape automated bonding techniques. As shown in FIG. 5, after the inner bond 28 is formed between the redundant interconnection lead 10 and the integrated circuit 22, the integrated circuit 22 is excised from the TAB tape at a point beyond the outer lead 42. Therefore, the outer lead 42 remains attached to the interconnection lead 10 and integrated circuit 22. The integrated circuit 22 is then positioned on the supporting substrate 44 and the appropriate outer lead bonds 46 between the outer leads 42 and the substrate 44 are formed.

Figure 7:
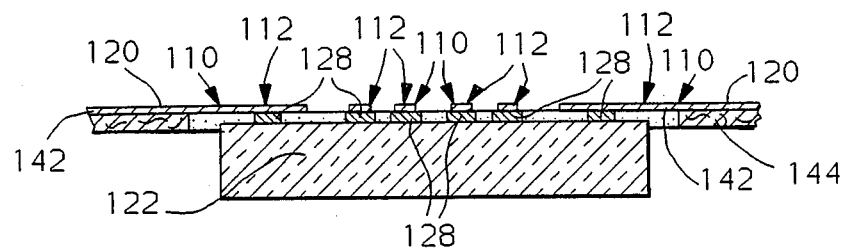
FIG. 7 is a side view of the redundant interconnection lead shown in FIG. 3.

The present invention is equally compatible with the flexible circuitry technology, as shown in FIGS. 6 and 7. A flexible circuit (FLEX) is used to form the electrical interconnections between the integrated circuit and the substrate, the substrate being an integral part of the flexible circuit itself. The FLEX circuit consists of a patterned arrangement of conductors on a flexible insulating base substrate generally fabricated from an organic material such as a polyimide or milar material. The substrate may be with or without cover layers. The FLEX circuit may be single or double sided, multi-layered, or rigidized, in addition to other possible arrangements. The FLEX circuit may be formed by several methods, such as by laminating copper foil to any of several base substrate materials, or alternatively pattern plating copper directly onto the substrate.

The flexible circuitry copper patterns may be patterned so as to include the redundant interconnection leads 110 at the appropriate locations. Therefore, the redundant interconnection leads 110 and interconnection conductors 142 are a single conductive pattern on the supporting substrate 144. With the use of flexible circuitry technology, the base 120 of the redundant interconnection 110 is integrated into the flexible, conductive interconnection pattern 142, so that the individual fingers 112 extend out from the flexible circuitry pattern 142, and are subsequently bonded to the integrated circuit 122 at bond pads 128. Because outer lead bonds are not required, a significant reduction in interconnection bonds is realized, therefore improving the producibility and reliability of the system.

The advantages of the present invention are many. Use of the redundant leads 10 and 110 decreases the electrical resistance within the circuit. This is due to the fact that the plurality of fingers 12 and 112 are bonded in such a way so as to be electrically in parallel at the bond pad 28 and 128. Because the electrical resistance of the circuit is decreased, correspondingly the current carrying capacity of the electrical circuit is increased.

In general, an inner bond formed between an interconnection lead and the integrated circuit is capable of carrying about 2-5 amperes of current. With the redundant bonds between each finger and the integrated circuit, the current carrying capacity of the interconnection lead is approximately multiplied by the number of redundant fingers. Therefore five or six individual redundant fingers may be required for a high current producing device. In an interconnection lead having such a high degree of redundancy, i.e., five or six fingers, the addition of one or more stress risors in the connection means may be preferable, although not necessary.

In addition, use of the redundant fingers improves the heat transfer characteristics of the integrated circuit assembly, therefore resulting in lower integrated circuit temperatures during bonding and operation. With redundant fingers, the heat generated during bonding and operation flows through a plurality of copper fingers for dissipation, instead of just a single path as with conventional methods.

Due to the improved heat transfer characteristics of the redundant bonds, the operating temperatures of the integrated circuit and assembly are reduced. The lower operating temperatures increase the reliability of the integrated circuit assembly. Reliability of the system is also enhanced due to the nature of the redundant bonds themselves. Because of the plurality of fingers comprised within each interconnection lead, if one bond fails between an individual finger and the bond pad, there are backup redundant interconnection bonds to ensure against failure of the entire assembly. This feature also significantly improves the reliability of the assembly.

A further benefit is realized with the present invention since interconnecting the individual fingers at two discrete regions, i.e., at the base and at the connector means, improves the structural stability and durability of the interconnection lead. Therefore, the susceptibility of the lead to deformation is significantly reduced. Improved structural stability correspondingly increases the producibility and quality of the assembly, therefore resulting in decreased system costs.

Further benefits are realized when stress risors are formed on the connection means. The addition of one or more stress risors on the connection means between the individual fingers limits the stresses generated between each individual finger and its bonding pad. The inclusion of one or more stress risors on the connection means is beneficial, however not necessarily required.

As a result of the interconnection lead designed in accordance with the present invention, a plurality of redundant bonds are formed between each individual finger and its corresponding bond pad on the integrated circuit. The present invention is entirely compatible with tape automated bonding and flexible circuitry technologies and provides an improved interconnection lead which is highly reliable and structurally durable, as well as characterized by highly efficient electrical operating characteristics.

While our invention has been described in terms of preferred embodiments, it is apparent that other forms could be adopted by one skilled in the art, such as redundant wire bonding in accordance with this invention for bonding leads to integrated circuits. Accordingly the scope of our invention is to be limited only by the following claims.

The embodiments of the invention in which an exclusive property or privilege is claimed are defined as follows:

1. An interconnection lead for electrical connection to an integrated circuit at a bonding pad, the interconnection lead comprising:
   (1) a plurality of electrically conductive fingers having a first end and a terminal end, each of said fingers being separated from the other of said fingers by an electrically insulative medium and each of said fingers having a bonding region which is disposed distinct and spaced from said first end;
   (2) an electrically conductive base, said plurality of fingers contacting said base at said first end of said fingers and extending outward from said base; and
   (3) connection means for connecting said fingers at a region distinct and spaced from said first end of said fingers, said connection means comprises at least one notched stress riser between a pair of said fingers;
   such that each of said electrically conductive fingers are to be electrically connected to the integrated circuit by bonding each of said fingers to the corresponding bond pad on the integrated circuit at each of said bonding regions.

2. An interconnection lead as stated in claim 1 wherein the number of said electrically conductive fingers ranges between two and six.

3. An interconnection lead as stated in claim 1 wherein said plurality of fingers and said base are formed from copper.

4. An interconnection lead as stated in claim 1 wherein said connection means contacts said terminal end of each of said fingers.

5. An interconnection lead as stated in claim 1 wherein said electrically insulative medium is air.

6. An article for electrically connecting an integrated circuit to a supporting substrate comprising:
   (A) an electrically conductive copper base;
   (B) a plurality of electrically conductive copper fingers having a first end and a terminal end, said fingers being separated by an electrically insulative medium, each of said fingers contacting said base at said first end and extending outward from said base, and each of said fingers having a bonding region which is distinct and spaced from said first end, wherein each of said fingers are bonded to a corresponding bond pad on the integrated circuit at said bonding region; and (C) electrically conductive connection means for connecting said fingers at a region distinct and spaced from said first end of said fingers, said connection means comprises at least one notched stress riser between a pair of said fingers.

7. An article as stated in claim 6 wherein the number of said fingers ranges between two and six.

8. An article as stated in claim 6 wherein said connection means contacts said fingers at said terminal end of said fingers.

* * * * *